(12) United States Patent
Wang

(10) Patent No.: US 11,997,868 B2
(45) Date of Patent: May 28, 2024

(54) DISPLAY DEVICE INCLUDING BUFFER FILLED INDENTED GLASS REGION

(71) Applicant: WUHAN CHINA STAR OPTOELECTRONICS SEMICONDUCTOR DISPLAY TECHNOLOGY CO., LTD., Hubei (CN)

(72) Inventor: Peng Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 326 days.

(21) Appl. No.: 17/286,472

(22) PCT Filed: Mar. 17, 2021

(86) PCT No.: PCT/CN2021/081240
§ 371 (c)(1),
(2) Date: Apr. 18, 2021

(87) PCT Pub. No.: WO2022/147902
PCT Pub. Date: Jul. 14, 2022

(65) Prior Publication Data
US 2022/0216448 A1    Jul. 7, 2022

(30) Foreign Application Priority Data
Jan. 5, 2021   (CN) .......................... 202110005457.1

(51) Int. Cl.
*H10K 50/84*       (2023.01)
*H10K 50/80*       (2023.01)
(Continued)

(52) U.S. Cl.
CPC ....... *H10K 50/844* (2023.02); *H10K 50/8426* (2023.02); *H10K 50/865* (2023.02);
(Continued)

(58) Field of Classification Search
CPC ............ H10K 50/844; H10K 50/8426; H10K 50/865; H10K 50/868; H10K 77/111; H01L 27/14678; F21K 9/66; G02F 1/133331
See application file for complete search history.

(56) References Cited

U.S. PATENT DOCUMENTS 6,320,137 B1    11/2001  Bonser et al.
9,389,454 B2 *   7/2016  Yamaguchi .............. G02F 1/29
(Continued)

FOREIGN PATENT DOCUMENTS

CN         101751821 A       6/2010
CN         101872035 A  * 10/2010  ............... G02B 1/10
(Continued)

*Primary Examiner* — Ida M Soward
(74) *Attorney, Agent, or Firm* — The Roy Gross Law Firm, LLC; Roy Grooss

(57) ABSTRACT

A display device is provided. The display device includes a cover plate, a first adhesive layer, a glass layer, a second adhesive layer, and a buffer layer. The first adhesive layer, the glass layer, and the second adhesive layer are sequentially disposed on a side of the cover plate. The glass layer is made of reinforced ultra-thin glass. Peripheral edges of the glass layer are indented with respect to peripheral edges of the first adhesive layer and the second adhesive layer to form an indented region. The buffer layer is disposed in the indented region.

18 Claims, 1 Drawing Sheet

(51) Int. Cl.
  *H10K 50/842* (2023.01)
  *H10K 50/844* (2023.01)
  *H10K 50/86* (2023.01)
  *F21K 9/66* (2016.01)
  *G02F 1/1333* (2006.01)
  *H01L 27/146* (2006.01)
  *H10K 102/00* (2023.01)

(52) U.S. Cl.
  CPC .............. *H10K 50/868* (2023.02); *F21K 9/66* (2016.08); *G02F 1/133331* (2021.01); *H01L 27/14678* (2013.01); *H10K 2102/311* (2023.02)

(56) References Cited

U.S. PATENT DOCUMENTS

| | | | | |
|---|---|---|---|---|
| 9,841,545 | B2* | 12/2017 | Mizutani | G02B 5/3033 |
| 2010/0061044 | A1* | 3/2010 | Zou | B32B 3/02 |
| | | | | 361/679.01 |
| 2011/0193121 | A1* | 8/2011 | Jeong | H01L 33/12 |
| | | | | 257/98 |
| 2011/0248237 | A1* | 10/2011 | Choi | H01L 33/385 |
| | | | | 257/13 |
| 2012/0295377 | A1* | 11/2012 | Sato | H01L 33/0093 |
| | | | | 257/E33.072 |
| 2013/0169920 | A1* | 7/2013 | Wada | G02B 3/14 |
| | | | | 349/200 |
| 2015/0103053 | A1* | 4/2015 | Lin | G06F 3/0412 |
| | | | | 345/175 |
| 2015/0346408 | A1* | 12/2015 | Mizutani | C08F 220/1806 |
| | | | | 428/41.5 |
| 2016/0093685 | A1* | 3/2016 | Kwon | H10K 77/111 |
| | | | | 257/40 |
| 2016/0102229 | A1* | 4/2016 | Takarada | C09J 7/38 |
| | | | | 156/60 |
| 2016/0152006 | A1* | 6/2016 | Boek | C03C 15/00 |
| | | | | 428/34.7 |
| 2016/0237319 | A1* | 8/2016 | Takarada | B32B 7/06 |
| 2017/0101553 | A1* | 4/2017 | Takarada | G02B 5/3033 |
| 2018/0150105 | A1* | 5/2018 | Hwang | G06F 1/1637 |
| 2019/0220649 | A1* | 7/2019 | Zhu | H10K 59/65 |
| 2020/0075895 | A1* | 3/2020 | Oh | H10K 50/8426 |
| 2020/0194724 | A1* | 6/2020 | Ahn | H10K 50/865 |
| 2020/0285095 | A1* | 9/2020 | Okumura | G02F 1/133305 |
| 2022/0354009 | A1* | 11/2022 | Zhang | G02B 5/3083 |

FOREIGN PATENT DOCUMENTS

| | | | | |
|---|---|---|---|---|
| CN | 202404565 | U | | 8/2012 |
| CN | 203786434 | A | | 8/2014 |
| CN | 204242134 | A | | 4/2015 |
| CN | 105094415 | A | | 11/2015 |
| CN | 106249959 | A | | 12/2016 |
| CN | 209281795 | U | | 8/2019 |
| CN | 110707229 | A | * 1/2020 | ............ G06F 3/041 |
| CN | 211087782 | U | | 7/2020 |
| CN | 211238259 | U | | 8/2020 |
| CN | 111833740 | A | | 10/2020 |
| WO | WO-2019178744 | A1 | * 9/2019 | ............ H10K 59/00 |

\* cited by examiner

DISPLAY DEVICE INCLUDING BUFFER FILLED INDENTED GLASS REGION

FIELD OF INVENTION

The present disclosure relates to the technical field of display, and particularly to a display device.

BACKGROUND

Currently, a surface of a foldable product is covered with a reinforced ultra-thin glass (UTG). However, due to characteristics of the reinforced ultra-thin glass itself, edges of the reinforced ultra-thin glass are susceptible to impacts, causing cracks and breakage.

Accordingly, it is necessary to provide a new display device to cushion and protect edges of foldable products.

SUMMARY OF DISCLOSURE

The present disclosure provides a display device, wherein a glass layer is disposed between a first adhesive layer and a second adhesive layer, the glass layer is made of reinforced ultra-thin glass, peripheral edges of the glass layer are indented with respect to peripheral edges of the first adhesive layer and the second adhesive layer to form an indented region, and a buffer layer is disposed in the indented region. The buffer layer can prevent adhesion between the first adhesive layer and the second adhesive layer, and protect the edges of the glass layer, thereby preventing cracks, breakage, and other problems, and increasing buffer effect.

In a first aspect, the present disclosure provides a display device comprising: a cover plate; a first adhesive layer disposed on a side of the cover plate; a glass layer disposed on the first adhesive layer and made of reinforced ultra-thin glass; a second adhesive layer disposed on the glass layer, wherein peripheral edges of the glass layer are indented with respect to peripheral edges of the first adhesive layer and the second adhesive layer to form an indented region; and a buffer layer disposed in the indented region.

In the display device, the buffer layer is made of a polymer glue.

In the display device, the first adhesive layer and the second adhesive layer are made of an optically clear adhesive.

The display device has a main display area and an edge area and further comprises a light shielding layer disposed on a side of the cover plate close to the first adhesive layer in the edge area.

In the display device, an orthographic projection of the light shielding layer on the cover plate covers an orthographic projection of the indented region on the cover plate.

The display device further comprises a display module. The display module comprises a function control layer disposed on a side of the glass layer away from the cover plate, and a display layer disposed on a side of the function control layer away from the glass layer.

In the display device, the display layer is a flexible organic light-emitting diode (OLED) display panel, and the function control layer is a touch layer or a polarizer.

The display device further comprises a back plate layer disposed on a side of the display module away from the cover plate.

In a second aspect, the present disclosure provides a display device comprising: a cover plate; a first adhesive layer disposed on a side of the cover plate; a glass layer disposed on the first adhesive layer; a second adhesive layer disposed on the glass layer, wherein one or more edges of the glass layer are indented with respect to corresponding edges of the first adhesive layer and the second adhesive layer to form an indented region; and a buffer layer disposed in the indented region.

In the display device, the glass layer is made of reinforced ultra-thin glass.

In the display device, the edges of the glass layer are indented with respect to the corresponding edges of the first adhesive layer and the second adhesive layer by a distance greater than or equal to 0.25 mm.

In the display device, the buffer layer is made of a polymer glue.

In the display device, the first adhesive layer and the second adhesive layer are made of an optically clear adhesive.

The display device has a main display area and an edge area and further comprises a light shielding layer disposed on a side of the cover plate close to the first adhesive layer in the edge area.

In the display device, an orthographic projection of the light shielding layer on the cover plate covers an orthographic projection of the indented region on the cover plate.

The display device further comprises a display module. The display module comprises a function control layer disposed on a side of the glass layer away from the cover plate, and a display layer disposed on a side of the function control layer away from the glass layer.

In the display device, the display layer is a flexible organic light-emitting diode (OLED) display panel, and the function control layer is a touch layer or a polarizer.

The display device further comprises a back plate layer disposed on a side of the display module away from the cover plate.

In a display device provided by the present disclosure, a glass layer is disposed between a first adhesive layer and a second adhesive layer, the glass layer is made of reinforced ultra-thin glass, peripheral edges of the glass layer are indented with respect to peripheral edges of the first adhesive layer and the second adhesive layer to form an indented region, and a buffer layer is disposed in the indented region. Compared with the prior art, the buffer layer can prevent adhesion between the first adhesive layer and the second adhesive layer, and protect the edges of the glass layer, thereby preventing cracks, breakage, and other problems, and increasing buffer effect.

Element numerals are described as follows:
100, 110: cover plate; 200, 210: first adhesive layer;
300, 310: glass layer; 400, 410: second adhesive layer;
500, 510: display module; 501, 511: function control layer;
502, 512: display layer; 1, 2: indented region;
10, 11: main display area; 20, 21: edge area;
600, 610: buffer layer; 700, 710: light shielding layer; and
800, 810: back plate layer.

DETAILED DESCRIPTION

The present disclosure provides a display device. In order to make purposes, technical solutions, and effects of the present invention clearer and more definite, the present invention will be further described in detail below with reference to accompanying drawings and embodiments. It should be understood that specific embodiments described herein are only used to explain the present invention, not used to limit the present invention.

Figure 1:
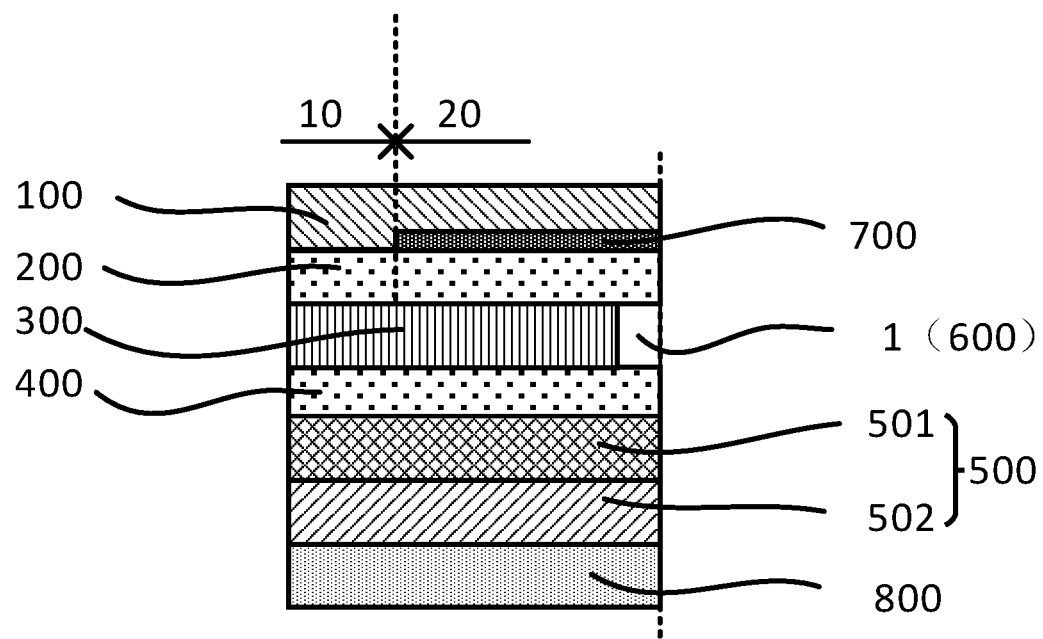
FIG. 1 is a schematic structural diagram of a display device according to an embodiment of the present disclosure.

Please refer to FIG. 1, which is a schematic structural diagram of a display device according to an embodiment of the present disclosure. The present disclosure provides a display device having characteristics such as good foldability and bendability. As shown in FIG. 1, the display device comprises a cover plate 100, a first adhesive layer 200, a glass layer 300, a second adhesive layer 400, and a display module 500. The glass layer 300 is disposed on a side of the cover plate 100. The display module 500 is disposed on a side of the glass layer 300 away from the cover plate 100. The first adhesive layer 200 is configured to fix the glass layer 300 to the cover plate 100. The second adhesive layer 400 is configured to fix the glass layer 300 to the display module 500. As shown in FIG. 1, one or more edges of the glass layer 300 are indented with respect to corresponding edges of the first adhesive layer 200 and the second adhesive layer 400 to form one or more indented regions 1.

The one or more edges of the glass layer 300 are indented with respect to the corresponding edges of the first adhesive layer 200 and the second adhesive layer 400 by a distance greater than or equal to 0.25 mm. Preferably, peripheral edges of the glass layer 300 are indented with respect to the corresponding edges of the display module 500 (or the first adhesive layer 210 and the second adhesive layer 410) by a distance greater than or equal to 0.25 mm to form the indented regions 1. The indented regions 1 are configured to improve impact resistance of the entire display device.

More specifically, FIG. 1 is only used as a preferred embodiment. FIG. 1 is only a cross-sectional view of one of edges of the display device, which shows that the indented region 1 is formed only at a right edge of the glass layer 300. In other embodiments, the indented region 1 may be formed only at a left edge of the glass layer 300. The indented regions 1 may also be formed only at opposite sides (for example, the right edge and the left edge) of the glass layer 300. Alternatively, preferably, the indented regions 1 are formed at all edges around the glass layer 300. The present disclosure does not limit a/an specific location, number, indented distance, or indented area of the indented regions 1. These parameters can be changed according to an actual model structure of the display device, and main purpose is to improve impact resistance of the display module 500.

In a preferred embodiment of the present disclosure, as shown in FIG. 1, the glass layer 300 is made of reinforced ultra-thin glass (UTG).

In this preferred embodiment, the reinforced ultra-thin glass has good foldability, good flexibility, smooth hand feel, good uniformity, high strength, high hardness, and good optical properties of glass. Therefore, the display module 500 provided with the reinforced ultra-thin glass has good impact resistance. When the glass layer 300 is broken by an impact, its fragments can be prevented from scattering, which is safer. The reinforced ultra-thin glass is suitable for foldable display devices. The display device may be a foldable mobile phone, a tablet computer, an electronic reader, an electronic photo album, an exhibition window, or the like.

In a manufacturing process of the reinforced ultra-thin glass, a common glass usually needs to be thinned by computer numeric control (CNC) edging or subsequent grinding and polishing processes to form ultra-thin glass, surfaces of the ultra-thin glass are chemically reinforced by ion exchange to obtain the reinforced ultra-thin glass, and strength of the reinforced ultra-thin glass is enhanced by laser processing.

In an embodiment of the present disclosure, the first adhesive layer 200 and the second adhesive layer 400 are preferably made of an optically clear adhesive (OCA). In other embodiments, the first adhesive layer 200 may be made of an optically clear adhesive tape, liquid optically clear adhesive (LOCA), optically clear resin (OCR), polyvinyl butyral, or ethylene-vinyl acetate copolymer. The second adhesive layer 400 may be made of an optically clear adhesive tape, liquid optically clear adhesive, optically clear resin, polyvinyl butyral, or ethylene-vinyl acetate copolymer. In some embodiments, the first adhesive layer 200 and the second adhesive layer 400 are both double-faced adhesive tape. The first adhesive layer 200 and the second adhesive layer 400 are configured to bond the cover plate 100 and the display module 500 to the glass layer 300, respectively, and realize double-sided support, which is beneficial to improve a sealing degree between the display module 500, the cover plate 100, and the glass layer 300.

As shown in FIG. 1, a buffer layer 600 is disposed in each of the indented regions 1. In FIG. 1, the buffer layer 600 overlaps with the corresponding indented region 1, and the buffer layer 600 is not shown with cross-section lines to ensure that the corresponding indented region 1 is clearly shown.

In this embodiment, the buffer layers 600 are disposed between the first adhesive layer 200 and the second adhesive layer 400. That is, the buffer layers 600 are disposed on a same layer as the glass layer 300, and are in contact with corresponding edges of the glass layer 300. The buffer layers 600 are supported and fixed between the first adhesive layer 200 and the second adhesive layer 400. This prevents the first adhesive layer 200 and the second adhesive layer 400 from adhering to each other in a natural state where the indented regions 1 are not filled. The buffer layers 600 are configured to indirectly protect the edges of the glass layer 300, thereby increasing buffer effect. The buffer layers 600 are made of a polymer glue. Preferably, the buffer layers 600 are made of room temperature vulcanized silicone rubber, silicone glue, polyurethane glue, polyvinyl butyral, or ethylene-vinyl acetate copolymer.

FIG. 1 mainly shows a structure of an edge of the display device, and an overall structure of the display device is not limited by FIG. 1. For example, in an embodiment, the cover plate 100 is preferably a three-dimensional (3D) cover plate or another flexible cover plate. When the cover plate 100 is a 3D cover plate, a surface of the cover plate 100 facing the display module 500 is concave, the cover plate 100 is configured to accommodate the display module 500, and the cover plate 100 and the display module 500 are attached to each other to form the display device. In other embodiments, the cover plate 100 may also have a planar structure.

Continue to see FIG. 1. In this embodiment, the display device has a main display area 10 and one or more edge areas 20. A light shielding layer 700 is disposed on a side of the cover plate 100 close to the first adhesive layer 200. The light shielding layer 700 is made of an opaque material. The light shielding layer 700 is configured to shield light. The light shielding layer 700 is disposed in the edge areas 20. As shown in FIG. 1, an orthographic projection of the light shielding layer 700 on the cover plate 100 covers an orthographic projection of each of the indented regions 1 on the cover plate 100.

Continue to see FIG. 1. The display module 500 is flexible and comprises a plurality of functional layers that are stacked. As shown in FIG. 1, the display module 500 comprises a function control layer 501 and a display layer 502 that are stacked. The function control layer 501 is disposed on a side of the glass layer 300 away from the cover plate 100. The display layer 502 is disposed on a side of the function control layer 501 away from the glass layer 300. More specifically, in this embodiment, the display module 500 is disposed on a side of the second adhesive layer 400 away from the glass layer 300. At this time, the function control layer 501 is disposed on the side of the second adhesive layer 400 away from the glass layer 300, and the display layer 502 is disposed on a side of the function control layer 501 away from the second adhesive layer 400.

It should be noted that, in this embodiment, the display layer 502 is a flexible organic light-emitting diode (OLED) display panel and comprises a thin film transistor array substrate. As a preferred embodiment, the function control layer 501 is a touch layer or a polarizer.

In other embodiments, the function control layer 501 may be, but is not limited to, a touch layer or a polarizer. The function control layer 501 may also be another functional layer to make performance of the display module 500 better. In an embodiment of the present disclosure, when the function control layer 501 is a touch layer, the touch layer may have an on-cell structure. The touch layer is disposed on the thin film transistor array substrate, and the touch control layer is connected to the thin film transistor array substrate. The thin film transistor array substrate sequentially comprises a thin film transistor array layer, an OLED light emitting layer, and a thin-film encapsulation layer. The OLED light emitting layer comprises an anode electrode, a hole injection layer, a hole transport layer, an organic light emitting layer, an electron transport layer, an electron injection layer, and a cathode electrode which are sequentially formed on the thin film transistor array substrate. The thin-film encapsulation layer covers the OLED light emitting layer.

In addition, in other embodiments, the touch layer may also have an in-cell structure. That is, the touch layer is changed to be built into the thin film transistor array substrate of the display layer 502.

In this embodiment, the display layer 502 is equivalent to a flexible imaging device and is configured for image display. The touch layer is configured to collect sensing signals and to implement a touch function. The touch layer may also be a flexible thin-film capacitive touch panel.

In a preferred embodiment, the display layer 502 is an OLED display panel, and the function control layer 501 is a polarizer. Because OLED is self-luminous, theoretically OLED may not require a polarizer required for liquid crystal display (LCD). However, external light will be reflected by the cathode electrode, which will affect a viewing effect and contrast. In order to solve the above problem, a polarizer + a ¼λ wave plate (i.e., circular polarizing filter) is used. When the external light passes through the polarizer first, a half of the external light cannot pass through. This half of the external light is deviated by 90 degrees from the original external light after being reflected by the ¼λ wave plate. The reflected light cannot pass through the polarizer, which solves the above problem. Therefore, when the function control layer 501 is a polarizer, it has an effect of preventing the external light from being reflected by the cathode electrode.

As shown in FIG. 1, the display device further comprises a back plate layer 800 disposed on a side of the display module 500 away from the cover plate 100. More specifically, the back plate layer 800 is disposed on a side of the display layer 502 away from the cover plate 100. In this embodiment, the back plate layer 800 supports the display module 500.

Figure 2:
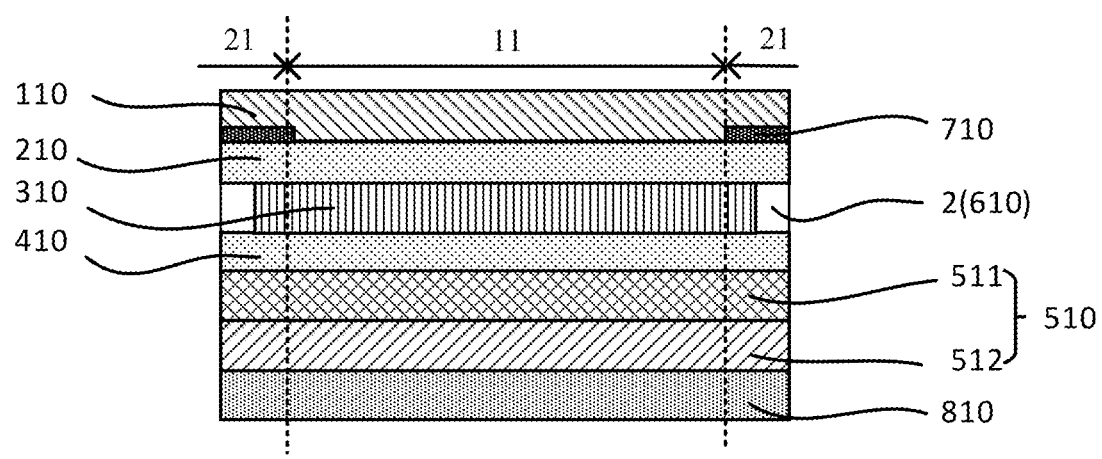
FIG. 2 is a schematic longitudinal cross-sectional view of a display device according to another embodiment of the present disclosure.

Please refer to FIG. 2. In a preferred embodiment of the present disclosure, a display device comprises a cover plate 110, a first adhesive layer 210, a glass layer 310, a second adhesive layer 410, a display module 510, and a back plate layer 810 stacked sequentially. The display module 510 comprises a function control layer 511 and a display layer 512 that are stacked. The function control layer 511 is disposed on a side of the glass layer 310 away from the cover plate 110. The display layer 512 is disposed on a side of the function control layer 511 away from the glass layer 310.

It should be particularly noted that, in this preferred embodiment, peripheral edges of the glass layer 310 are all indented with respect to peripheral edges of the display module 510 (or the first adhesive layer 210 and the second adhesive layer 410) to form an indented region 2. It can be understood from FIG. 2 that FIG. 2 only schematically shows that opposite edges of the glass layer 310 are indented with respect to the corresponding edges of the display module 510 to form the indented regions 2. Although FIG. 2 only shows that the indented regions 1 are formed at a right edge and a left edge of the glass layer 310, in fact, in this preferred embodiment, the peripheral edges of the glass layer 310 are all actually indented with respect to the peripheral edges of the display module 510 to form the indented region 2.

In other embodiments, the indented region 2 may be replaced by only two indented regions formed at the opposite edges (for example, the right edge and the left edge) of the glass layer 310. That is, the opposite edges of the glass layer 310 are indented with respect to corresponding opposite edges of the display module 510 (or the first adhesive layer 210 and the second adhesive layer 410 of the display device) to form the two indented regions. That is, the two indented regions are respectively formed on the opposite sides of the glass layer 310.

In the display device as shown in FIG. 2, a/an specific location, number, indented distance, or indented area of the indented region 2 are not limited. These parameters can be changed according to an actual model structure of the display device, and main purpose is to improve impact resistance of the display module 510.

Furthermore, the display device has a main display area 11 and one or more edge areas 21. A light shielding layer 710 is disposed on a side of the cover plate 110 close to the first adhesive layer 210. The light shielding layer 710 is disposed in the edge areas 21. As shown in FIG. 2, an orthographic projection of the light shielding layer 710 on the cover plate 110 covers an orthographic projection of the indented region 2 on the cover plate 110.

Moreover, a buffer layer 610 is disposed in the indented region 2. In this embodiment, the buffer layer 610 is disposed between the first adhesive layer 210 and the second adhesive layer 410. That is, the buffer layer 610 is disposed on a same layer as the glass layer 310, and is in contact with corresponding edges of the glass layer 310. The buffer layer 610 is supported and fixed between the first adhesive layer 210 and the second adhesive layer 410. This prevents the first adhesive layer 210 and the second adhesive layer 410 from adhering to each other in a natural state where the indented region 2 is not filled. The buffer layer 610 is configured to indirectly protect the edges of the glass layer 310, thereby increasing buffer effect.

In the display device provided by the present disclosure, the one or more edges of the glass layer are indented with respect to the corresponding edges of the first adhesive layer and the second adhesive layer to form the one or more indented regions. Specifically, the peripheral edges of the glass layer may be indented with respect to the peripheral edges of the first adhesive layer and the second adhesive layer to form the indented regions. The opposite edges of the glass layer may be indented with respect to the corresponding opposite edges of the first adhesive layer and the second adhesive layer to form the indented regions. A buffer layer is disposed in each of the indented regions. The glass layer is made of reinforced ultra-thin glass. The buffer layers can prevent adhesion between the first adhesive layer and the second adhesive layer, and protect the edges of the glass layer, thereby preventing cracks, breakage, and other problems, and increasing buffer effect.

For specific implementation of each of the aforementioned elements, please refer to the previous embodiment, which will not be described in detail herein.

It should be understood that those skilled in the art may make equivalent replacements or changes based on the technical solutions and inventive concepts of the present application, and all such changes or replacements shall fall within the scope of the claims of the present application.

What is claimed is:

1. A display device, comprising:
    a cover plate;
    a first adhesive layer disposed directly on a side of the cover plate;
    a glass layer disposed on the first adhesive layer and made of reinforced ultra-thin glass;
    a second adhesive layer disposed on the glass layer, wherein peripheral edges of the glass layer are indented with respect to peripheral edges of the first adhesive layer and the second adhesive layer to form an indented region; and
    a buffer layer disposed in the indented region.

2. The display device according to claim 1, wherein the buffer layer is made of a polymer.

3. The display device according to claim 1, wherein the first adhesive layer and the second adhesive layer are made of an optically clear adhesive.

4. The display device according to claim 1, wherein the display device has a main display area and an edge area and further comprises:
    a light shielding layer disposed on a side of the cover plate close to the first adhesive layer in the edge area.

5. The display device according to claim 4, wherein an orthographic projection of the light shielding layer on the cover plate covers an orthographic projection of the indented region on the cover plate.

6. The display device according to claim 1, further comprising a display module, wherein the display module comprises:
    a function control layer disposed on a side of the glass layer away from the cover plate; and a display layer disposed on a side of the function control layer away from the glass layer.

7. The according to claim 6, wherein the display layer is a flexible organic light-emitting diode (OLED) display panel, and the function control layer is a touch layer or a polarizer.

8. The display device according to claim 6, further comprising:
    a back plate layer disposed on a side of the display module away from the cover plate.

9. A display device, comprising:
    a cover plate;
    a first adhesive layer disposed directly on a side of the cover plate;
    a glass layer disposed on the first adhesive layer, a second adhesive layer disposed on the glass layer, wherein one or more edges of the glass layer are indented with respect to corresponding edges of the first adhesive layer and the second adhesive layer to form one or more indented regions; and
    a buffer layer disposed in each of the indented regions.

10. The display device according to claim 9, wherein the glass layer is made of reinforced ultra-thin glass.

11. The display device according to claim 10, wherein the edges of the glass layer are indented with respect to corresponding edges of the first adhesive layer and the second adhesive layer by a distance greater than or equal to 0.25 mm.

12. The display device according to claim 9, wherein the buffer layers are made of a polymer.

13. The display device according to claim 9, wherein the first adhesive layer and the second adhesive layer are made of an optically clear adhesive.

14. The display device according to claim 9, wherein the display device has a main display area and an edge area and further comprises:
    a light shielding layer disposed on a side of the cover plate close to the first adhesive layer in the edge area.

15. The according to claim 14, wherein an orthographic projection of the light shielding layer on the cover plate covers orthographic projections of the indented regions on the cover plate.

16. The display device according to claim 9, further comprising a display module, wherein the display module comprises:
    a function control layer disposed on a side of the glass layer away from the cover plate; and
    a display layer disposed on a side of the function control layer away from the glass layer.

17. The display device according to claim 16, wherein the display layer is a flexible organic light-emitting diode (OLED) display panel, and the function control layer is a touch layer or a polarizer.

18. The display device according to claim 16, further comprising:
    a back plate layer disposed on a side of the display module away from the cover plate.

* * * * *